US012687595B2

(12) United States Patent
Martynowych et al.

(10) Patent No.: US 12,687,595 B2
(45) Date of Patent: Jul. 21, 2026

(54) DIGITAL LOCK-IN FOR MAGNETIC IMAGING WITH NITROGEN VACANCY CENTERS IN DIAMONDS

(71) Applicant: The MITRE Corporation, McLean, VA (US)

(72) Inventors: Dmitro Jaroslau Martynowych, Cambridge, MA (US); David Allen Hopper, Philadelphia, PA (US); Sean Mitchell Oliver, McLean, VA (US)

(73) Assignee: The MITRE Corporation, McLean, VA (US)

( * ) Notice: Subject to any disclaimer, the term of this patent is extended or adjusted under 35 U.S.C. 154(b) by 133 days.

(21) Appl. No.: 18/531,226

(22) Filed: Dec. 6, 2023

(65) Prior Publication Data

US 2024/0192294 A1     Jun. 13, 2024

Related U.S. Application Data

(60) Provisional application No. 63/430,790, filed on Dec. 7, 2022.

(51) Int. Cl.
  *G01R 33/32*          (2006.01)
  *G01R 33/48*          (2006.01)
(52) U.S. Cl.
  CPC ........... *G01R 33/323* (2013.01); *G01R 33/48* (2013.01)
(58) Field of Classification Search
  None
  See application file for complete search history.

(56) References Cited

U.S. PATENT DOCUMENTS

| | | | | |
|---|---|---|---|---|
| 9,541,610 B2 * | 1/2017 | Kaup | ................... | G01R 33/032 |
| 10,228,429 B2 * | 3/2019 | Bruce | ................... | G01R 33/26 |
| 11,519,989 B2 * | 12/2022 | Turner | ................. | G01R 33/389 |
| 2011/0062957 A1 | 3/2011 | Fu et al. | | |
| 2016/0313408 A1 | 10/2016 | Hatano et al. | | |
| 2016/0356863 A1 | 12/2016 | Boesch et al. | | |
| 2017/0343695 A1 * | 11/2017 | Stetson | ................. | G01V 3/101 |
| 2018/0284026 A1 | 10/2018 | Shao et al. | | |
| 2019/0285706 A1 * | 9/2019 | Sekelsky | .............. | G01R 33/032 |
| 2021/0239779 A1 | 8/2021 | Turner et al. | | |

OTHER PUBLICATIONS

Kehayias, et al., Measurement and Simulation of the Magnetic Fields from a 555 Timer Integrated Circuit Using a Quantum Diamond Microscope and Finite-Element Analysis, Physical Review Applied 17, 014021 (2022) (Year: 2022).*
Turner, et al., Magnetic Field Fingerprinting of Integrated-Circuit Activity with a Quantum Diamond Microscope, Physical Review Applied 14, 014097 (2020) (Year: 2020).*
Bauch et al., (2018). "Ultralong Dephasing Times in Solid-State Spin Ensembles via Quantum Control", American Physical Society, Physical Review X 8, 031025. (11 pages).

* cited by examiner

*Primary Examiner* — Rodney E Fuller
(74) *Attorney, Agent, or Firm* — Morrison & Foerster LLP

(57)          ABSTRACT

Systems and methods for measuring integrated circuit activity use the spatial resolution of optically detected magnetic resonance (ODMR) of nitrogen-vacancies (NV) in diamond. A quantum diamond microscope (QDM) can be used to capture a series of images of the fluorescence of NV centers present in diamond as a function of an external microwave field. An IC device placed adjacent to the diamond of the QDM will impact the fluorescence of the NV center, and this magnetic field-dependent fluorescence can be measured and used to generate a map of the magnetic field of the IC device.

25 Claims, 8 Drawing Sheets

Sweep parameter settings
502

Measure fluorescence at each parameter setting
504

Identify point(s) to measure fluorescence emission
506

500

DIGITAL LOCK-IN FOR MAGNETIC IMAGING WITH NITROGEN VACANCY CENTERS IN DIAMONDS

CROSS-REFERENCE TO RELATED APPLICATIONS

This application claims the benefit of U.S. Provisional Application No. 63/430,790, filed Dec. 7, 2022, the entire contents of which is incorporated herein by reference.

FIELD OF THE DISCLOSURE

The present invention relates to quantum diamond microscopy, and more specifically, to localizing integrated circuit activity by spatially resolving the magnetic field-dependent fluorescence of nitrogen-vacancy (NV) centers in diamond and generating magnetic field maps from that fluorescence.

BACKGROUND OF THE DISCLOSURE

Analysis of integrated circuit (IC) activity is important for a variety of applications including design validation, quality control, failure analysis, and security. In the context of failure analysis, a defective IC device is analyzed to identify the point of failure. The process typically involves non-destructive analysis techniques to localize the failure followed by destructive analysis techniques to identify the root cause. Destructive analysis techniques assess the chip layer-by-layer, incrementally destroying layers of the chip and applying analysis techniques ranging from microscopy, beam etching, chemical analysis, surface analysis tools, spectroscopic analysis, etc., until locating the point of failure. The entire process can cost over $20,000 per failed device and take numerous days to perform.

Non-destructive techniques for analyzing failures of IC chips typically rely on direct electrical or optical methods to locate points of failure and preserve the integrity of the component. These techniques are fast at providing rough two-dimensional localization of failure sites. In the case of optical methods, these approaches are not suited to providing three-dimensional localization of areas of interest, which can be necessary when assessing the current flow in state-of-the art stacked IC devices. Furthermore, with a stack of IC devices, direct optical methods cannot penetrate beyond the outer layer of the stack, and therefore cannot be used to assess activity within a stack of IC devices (e.g., a multi-layer IC device).

Detection of magnetic field emanations from ICs provides a means to non-destructively measure the activity within a stack of IC devices. Current-carrying components in active IC devices, such as power and clock distribution networks, input/output lines, word and bit lines, switching transistors, etc., produce magnetic fields that can be measured to reveal the paths of current flow within a device. In general, these magnetic field emanations pass unaltered through standard IC materials and vary spatially and temporally in ways that correlate with both IC architecture and operational state. Thus, high-resolution maps of IC magnetic fields can simultaneously yield structural and functional information that can be used to locate points of failure and map current activity.

SUMMARY OF THE DISCLOSURE

Disclosed herein are systems and methods for measuring integrated circuit activity via spatial resolution of optically detected magnetic resonance (ODMR) of nitrogen-vacancies (NV) in diamond. A quantum diamond microscope (QDM) can be used to capture a series of images of the fluorescence of NV centers present in diamond as a function of an external microwave field. An IC device placed adjacent to the diamond of the QDM will impact the fluorescence of the NV center, and this magnetic field-dependent fluorescence can be measured and used to generate a map of the magnetic field of the IC device.

To image magnetic fields from an IC device using a QDM, an NV-diamond chip is placed directly on top or near to the IC device so that the NV centers of the NV-diamond chip can interact with the magnetic fields of the IC device, which impacts the fluorescence emitted from the diamond. The fluorescence emitted from the diamond is measured using ODMR spectroscopy and can be used to localize the activity of the device and generate a magnetic field map of the IC device without actually calculating the magnetic field of the device.

The ODMR protocol for obtaining spatially resolved magnetic field images relies on using a camera to monitor the fluorescence emitted from an ensemble of NV centers in diamond as a function of applied microwave field frequency. A typical ODMR measurement protocol involves applying hundreds of microwave frequencies and measuring the fluorescence emitted at each camera pixel. Microwave frequencies resonant with the magnetic field-dependent NV center electron spin transitions result in a decrease in fluorescence. The measured spectra at each pixel of the camera are fit to a curve to extract the resonant frequencies, which is then used to create a spatially-resolved magnetic field image of the IC device. Although this process is useful for obtaining high-resolution magnetic field maps with information about the absolute magnetic field amplitudes, measuring and mapping hundreds of data points is a time consuming and computationally intensive process. Accordingly, there exists a need for systems and methods to generate magnetic field images of IC devices that are more economical, simplified, and faster than existing measurement protocols.

The QDM digital lock-in sensing protocol disclosed herein reduces the number of microwave frequencies applied from hundreds to a few (for example, between 1-16) to decrease data collection time and more quickly localize activity in an IC without the need for calculating absolute magnetic field amplitudes. The QDM systems and methods described herein involve a measurement protocol that includes initializing the NV centers in a diamond into a sensing state wherein the NV electrons emit red fluorescence, measuring fluorescence from the diamond as the NV centers interact with a sample's (e.g., an IC device) magnetic fields, and converting that measured fluorescence to magnetic field images.

To calculate a relative magnetic field of an IC device using a single measurement, the QDM measurement protocol can include applying one or more microwave frequencies and measuring the fluorescence of the diamond when the IC device is not impacting the fluorescence of the diamond to establish a baseline fluorescence, which can be used later for subtraction. Next, the IC device can be configured into an operation mode (such as by electrical connection, computer control, or physical manipulation) such that the IC device affects the fluorescence emitted from the diamond, and the protocol includes again applying one or more microwave frequencies and measuring the fluorescence of the diamond to establish an operational fluorescence. A digital lock-in technique can then be applied, wherein the operational fluorescence is subtracted from the baseline fluorescence to generate a spatial map of the relative changes of the magnetic field that were induced by the operation of the IC device. This spatial map can be used to infer the operation and/or failure of the IC device.

The digital lock-in QDM measurement protocols described herein localize the activity of an IC device through magnetic field measurements with application of a smaller number of microwave frequencies during an ODMR scan. This can reduce the time and computational requirements of typical ODMR measurement protocols. In one or more examples, the digital lock-in measurement protocol described herein can be performed at frame rates comparable to traditional videos (e.g., 30 Hz and 60 Hz), making the protocol useful for a variety of purposes from micro-electronics quality control to security applications.

In one or more examples, a system comprises a memory, one or more processors, wherein the memory stores one or more programs that when executed by the one or more processors, cause the one or more processors to: control a plurality of components to operate at a first parameter setting, the plurality of components comprising: a coherent light source configured to generate a light beam directed at a single crystal diamond, the single crystal diamond having a plurality of NV centers and configured to generate fluorescence in response to being illuminated by the coherent light source, a microwave (MW) radiation source configured to irradiate the single crystal diamond with a MW signal, a magnetic field source configured to apply a bias magnetic field to the single crystal diamond, and a photosensor configured to measure the fluorescence generated by the single crystal diamond, measure the fluorescence emitted from the single crystal diamond based on the first parameter setting, wherein the fluorescence emitted is impacted by a magnetic field-generating article disposed adjacent the single crystal diamond, and determine the relative magnetic vector field of the magnetic field-generating article based on the measured fluorescence emitted from the single crystal diamond based on the first parameter setting.

The one or more programs when executed by the one or more processors may cause the one or more processors to: control the plurality of components to operate at a second parameter setting, measure the fluorescence emitted from the single crystal diamond based on the second parameter setting, and determine the relative magnetic vector field of the magnetic field-generating article based on the measured fluorescence emitted from the single crystal diamond based on the first parameter setting and the second parameter setting.

The one or more programs when executed by the one or more processors, can cause the one or more processors to acquire a baseline fluorescence measurement, wherein acquiring the baseline fluorescence measurement comprises measuring the fluorescence emitted by the single crystal diamond when the fluorescence emitted is not impacted by the magnetic field-generating article.

The one or more programs when executed by the one or more processors may cause the one or more processors to determine the relative magnetic vector field of the magnetic field-generating article based on the measured fluorescence signal emitted from the single crystal diamond based on the first parameter setting and the baseline fluorescence measurement.

The one or more programs when executed by the one or more processors cause the one or more processors to select the first parameter setting, and selecting the first parameter setting can comprise: controlling the plurality of components to operate at a plurality of parameter settings, measuring the fluorescence emitted from the single crystal diamond based on a plurality of the plurality of parameter settings, wherein the fluorescence emitted is not impacted by the magnetic field-generating article, generating an optically-detected magnetic resonance (ODMR) spectrum based on the measured fluorescence emitted from the single crystal diamond at the plurality of the plurality of parameter settings, and selecting the first parameter setting based on the generated ODMR spectrum.

Selecting the first parameter setting based on the generated ODMR spectrum may comprise identifying one of the plurality of fluorescence signals wherein the ODMR spectrum has a maximum slope. The plurality of parameter settings can correspond to values of one or more of MW signal power, MW signal frequency, MW signal duration, and the strength of the bias magnetic field. The plurality of parameter settings may correspond to values of one or more of an environmental temperature of the system and an environmental humidity of the system. The plurality of parameter settings can correspond to values of one or more of a position of the single crystal diamond relative to the magnetic field-generating article and an orientation of the single crystal diamond relative to the magnetic field-generating article. The plurality of parameter settings can correspond to values of one or more of an intensity of the light beam, a wavelength of the light beam, a beam shape of the light beam, a spot size of the light beam, a duration of the light beam, and an angle of incidence of the light beam. The plurality of parameter settings may correspond to values of one or more of a direction of the bias magnetic field and a temporal pattern of the bias magnetic field. The plurality of parameter settings may correspond to values of one or more of photosensor gain, photosensor position, photosensor orientation, photosensor exposure time, photosensor temporal exposure pattern, photosensor sensitivity, and photosensor spectral range.

The photosensor of the system may comprise one or more selected from the group of: a CMOS, a CCD, a photodiode array, and a single photodiode. The coherent light source can comprise a laser. The microwave source may comprise one or more microwave resonators or a microwave loop. The magnetic field source can comprise one or more Helmholtz coils and/or one or more permanent magnets.

In one or more examples, a method comprises controlling a plurality of components to operate at a first parameter setting, wherein the plurality of components comprise: a coherent light source configured to generate a light beam directed at a single crystal diamond, the single crystal diamond having a plurality of NV centers and configured to generate fluorescence in response to being illuminated by the coherent light source, a microwave (MW) radiation source configured to irradiate the single crystal diamond with a MW signal, and a magnetic field source configured to apply a bias magnetic field to the single crystal diamond, measuring the fluorescence emitted from the single crystal diamond based on the first parameter setting, and determining the relative magnetic vector field of the magnetic field-generating article based on the measured fluorescence emitted from the single crystal diamond based on the first parameter setting.

A non-transitory computer-readable storage medium can store instructions that, when executed by a computing device operatively coupled to a plurality of components, cause the computing device to: control the plurality of components to operate at a first parameter setting, the plurality of components comprising: a coherent light source configured to generate a light beam directed at a single crystal diamond, the single crystal diamond having a plurality of NV centers and configured to generate fluorescence in response to being illuminated by the coherent light source, a microwave (MW) radiation source configured to irradiate the single crystal diamond with a MW signal, a magnetic field source configured to apply a bias magnetic field to the single crystal diamond, and a photosensor configured to measure the fluorescence generated by the single crystal diamond, measure the fluorescence emitted from the single crystal diamond based on the first parameter setting, wherein the fluorescence emitted is impacted by a magnetic field-generating article disposed adjacent the single crystal diamond, and determine the relative magnetic vector field of the magnetic field-generating article based on the measured fluorescence emitted from the single crystal diamond based on the first parameter setting.

Additional advantages will be readily apparent to those skilled in the art from the following detailed description. The aspects and descriptions herein are to be regarded as illustrative in nature and not restrictive. It will be appreciated that any of the variations, aspects, features, and options described in view of the systems apply equally to the methods and vice versa. It will also be clear that any one or more of the above variations, aspects, features, and options can be combined.

All publications, including patent documents, scientific articles, and databases, referred to in this application are incorporated by reference in their entirety for all purposes to the same extent as if each individual publication were individually incorporated by reference. If a definition set forth herein is contrary to or otherwise inconsistent with a definition set forth in the patents, applications, published applications and other publications that are herein incorporated by reference, the definition set forth herein prevails over the definition that is incorporated herein by reference.

BRIEF DESCRIPTION OF THE FIGURES

The invention will now be described, by way of example only, with reference to the accompanying drawings, in which.

DETAILED DESCRIPTION OF THE DISCLOSURE

Figure 1A:
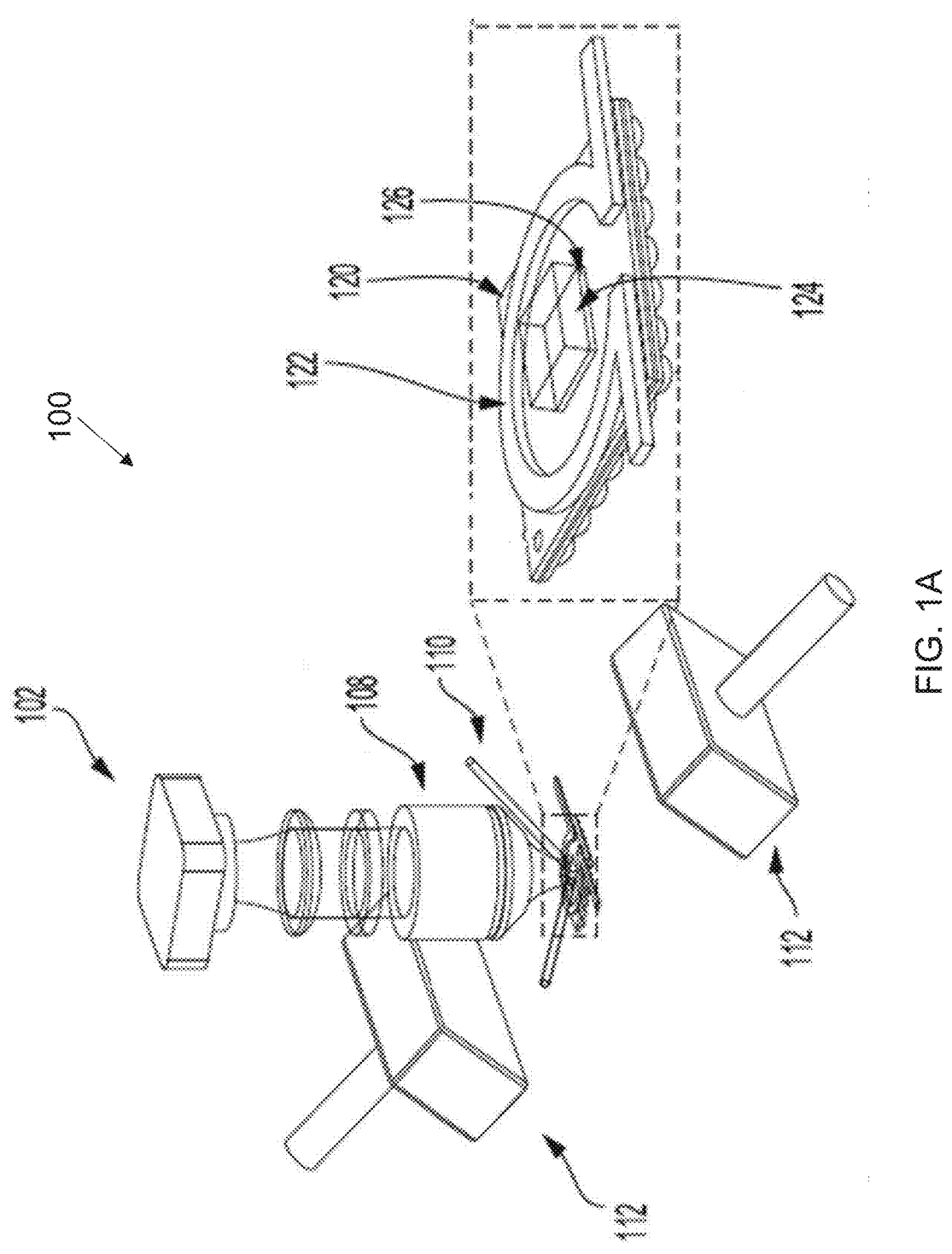
FIG. 1A shows a schematic view of an exemplary QDM system, according to one or more examples of the disclosure.

The present disclosure relates to systems and methods for analyzing magnetic field-generating articles, including but not limited to digital and analog integrated circuits (ICs), particularly to detection, measurement, and imaging of static and dynamic vector magnetic fields generated by current densities within magnetic field-generating articles. Imaging vector magnetic fields of IC devices can be useful in a variety of IC applications, such as design analysis and testing, failure analysis, identification and fingerprinting of ICs, electromagnetic side channel analysis, reverse engineering, and any IC analysis that can utilize information regarding IC magnetic field emanations. It should be noted that while the present disclosure refers to ICs, the same or similar techniques disclosed herein may be applicable to any magnetic field-generating article including any electronic system, electronic device, electronic component, microelectronic, microprocessor, and/or circuit-based article.

In the following description of the various examples, reference is made to the accompanying drawings, in which are shown, by way of illustration, specific examples that can be practiced. The description is presented to enable one of ordinary skill in the art to make and use the invention and is provided in the context of a patent application and its requirements. Various modifications to the described examples will be readily apparent to those persons skilled in the art and the generic principles herein may be applied to other examples. Thus, the present invention is not intended to be limited to the examples shown but is to be accorded the widest scope consistent with the principles and features described herein.

As used herein, the singular forms "a," "an," and "the" used in the following description are intended to include the plural forms as well unless the context clearly indicates otherwise. It is to be understood that the term "and/or" as used herein refers to and encompasses any and all possible combinations of one or more of the associated listed items. It is further to be understood that the terms "includes," "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

As explained above, the magnetic field emanations of an IC device can provide information about the structure and function of complicated IC devices and stacked IC devices. One method of measuring magnetic field emanations of an IC device is to use a quantum diamond microscope (QDM) to capture spatially-resolved optically detected magnetic resonance (ODMR) spectra of nitrogen-vacancy (NV) centers in a diamond placed adjacent to an IC device, and to convert this data into a series of magnetic field maps representing the activity of the IC device. One QDM measurement protocol for imaging magnetic field emanations relies on measuring magnetic field-dependent NV center fluorescence of an IC device at hundreds of applied microwave frequencies. Curve fitting is then used to extract NV center resonant frequencies from those measurements, which can be used to calculate and map the absolute magnetic field of the IC device. Mapping the absolute magnetic field of an IC device in this manner, however, is a time-consuming and computationally intensive endeavor. Accordingly, there exists a need for a measurement protocol to generate magnetic field images of IC devices that is more economical, simplified, and faster than existing measurement protocols.

Presented herein are systems and methods for measuring the relative magnetic field of an IC device via imaging the fluorescence of magnetically-sensitive NV centers in diamond using a QDM. Instead of generating and spatially resolving an absolute magnetic field that requires hundreds of measurements of diamond fluorescence intensity as a function of applied microwave frequency (or other operational parameter), the systems and methods described herein employ a digital lock-in technique to localize activity in an IC device by obtaining a small number (such as one or two) of measurements of diamond fluorescence intensity, determining a difference between those measurements, and using the difference to determine a relative magnetic field, which can be used to localize the activity in the IC device.

In one or more examples, a QDM can excite the NV center electrons in a crystal diamond using a coherent light source and manipulate their spin using a microwave (MW) radiation source while subjecting the diamond to a bias magnetic field. When excited, the diamond emits fluorescence, which can be measured with a photosensor. The fluorescence emitted from the diamond can be affected by the magnetic field of an IC device when configured into an operational mode (such as by electrical connection, computer control, or physical manipulation). Magnetic field maps of features in the IC device can be generated by analyzing photos of the magnetic-field dependent fluorescence of the diamond when the IC device affects the diamond fluorescence (e.g., when in the operational mode). In one or more examples, the digital lock-in measurement protocols described herein can localize IC activity by spatially resolving magnetic field emanations using just one or two images of the fluorescence, and may be performed in near real-time.

Figure 1B:
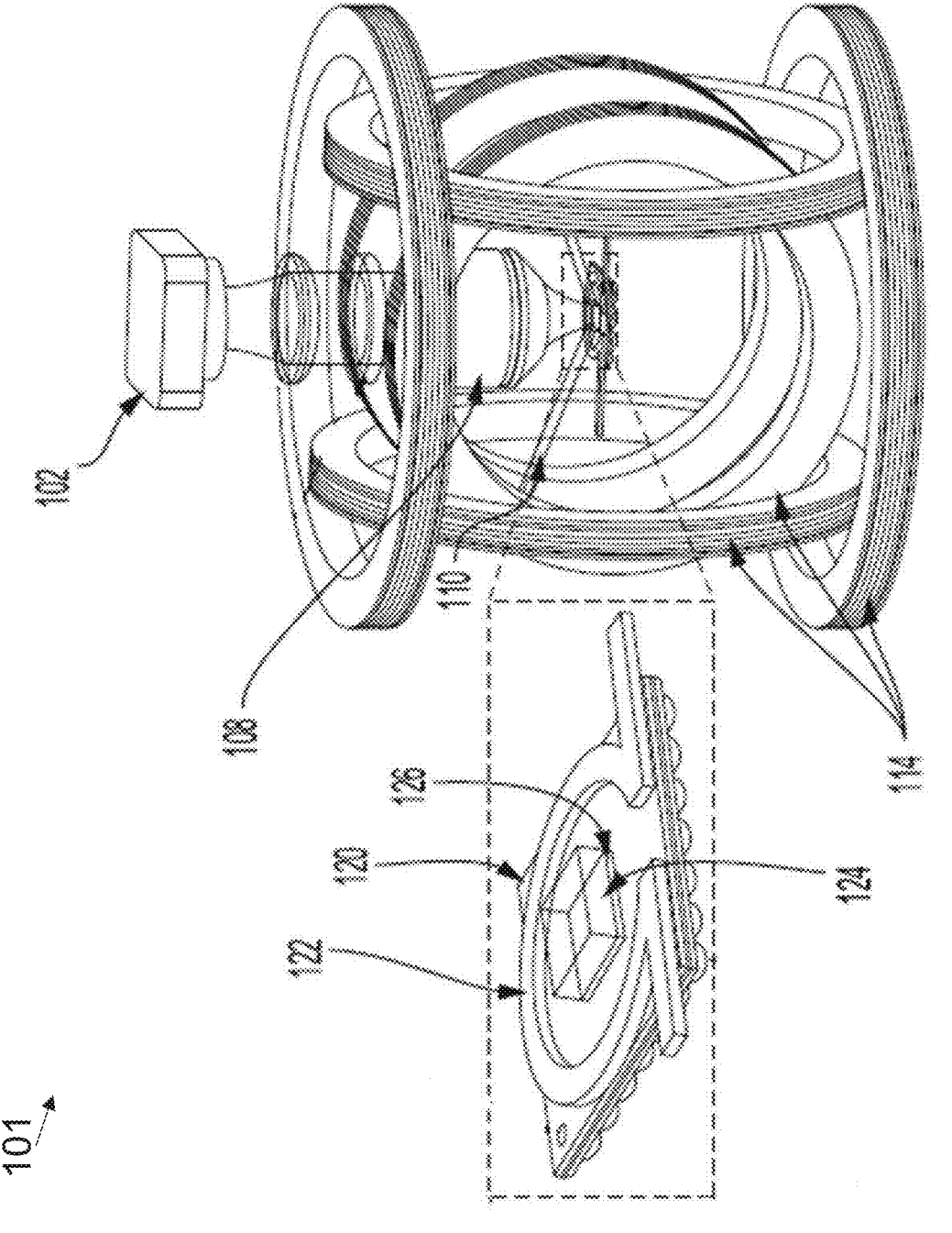
FIG. 1B shows a schematic view of an exemplary QDM system, according to one or more examples of the disclosure.

FIGS. 1A-B show a schematic view of exemplary quantum diamond microscope systems 100 and 101, respectively, according to one or more examples of the present disclosure. The system 100 and system 101 can rely on nitrogen-vacancy (NV) centers in crystal diamond (such as an engineered diamond chip) to measure and map magnetic fields of a magnetic field-generating article (such as an IC).

Referring first to FIG. 1A, in one or more examples, the system 100 can include a photosensor 102, a microscope objective 108, an excitation laser 110, a microwave loop 122, and a magnetic field-generating article 120 (e.g., an IC), positioned proximate to a single crystal diamond 124 (e.g., diamond substrate) that contains an NV layer 126. To provide a bias magnetic field source, the system 100 can include a pair of magnets 112 (e.g., permanent magnets). The system 101 of FIG. 1B differs from the system 100 of FIG. 1A only in that rather than magnets 112, the system 101 includes Helmholtz coils 114 to provide a bias magnetic field source.

In one or more examples, either of systems 100 or 101 can operate three driving fields—optical, bias magnetic, and microwave (MW)—to manipulate the NV electronic- and spin-state populations in a controlled manner. In one or more examples, the excitation laser 110 can act as a coherent light source that drives the optical field of the system 100. In one or more examples, the magnets 112 (of system 100 of FIG. 1A) and/or the Helmholtz coils 114 (of system 101 of FIG. 1B) can provide a bias magnetic field source that lifts the degeneracy of the NV center electron spin states to enable magnetic field measurements of the system 100. In one or more examples, the microwave loop 122 can act as a microwave source that drives the microwave field of the system 100.

In one or more examples, the excitation laser 110 can illuminate the single crystal diamond 124 with a light beam to drive the optical field of the system 100. In one or more examples, an incident angle of the light beam generated by the laser 110 on the single crystal diamond 124 may be tuned to achieve total internal reflection within the single crystal diamond 124 and minimize direct illumination of the magnetic field-generating article 120. In one or more examples, direct illumination of the magnetic field-generating article 120 could yield interactions between the laser 110 and magnetic field-generating article 120 causing unwanted changes in characteristics of the magnetic field-generating article 120. Optionally, the laser 110 can be a 532 nm, CW laser (Lighthouse Photonics Sprout-H-10W).

In one or more examples, the power of the light beam generated by the laser 110 may be selected so as to sufficiently saturate the photosensor 102. The power level required to sufficiently saturate the photosensor 102 may depend on one or more characteristics of the single crystal diamond 124 (e.g., the intensity at which the diamond fluoresces in response to the light source). In one or more examples, a beam shape of the light beam generated by the laser 110 may be configured according to experimental needs. For example, the light beam may be shaped by a beam shaper, such as a flat-top beam shaper, to provide a uniform illumination power across the diamond over the field of view of the microscope objective 108. Optionally, the system 100 can include a flat-top beam shaping element (Eksma Optics GTH-5-250-4-VIS) and a cylindrical lens (Thorlabs LJ1559RM-A) to create a rectangular beam profile (6 mm×6 mm) incident on the top face of the single crystal diamond 124 at a sufficiently shallow angle of incidence (4 degrees) relative to the top surface, thereby illuminating the entire NV layer 126.

In one or more examples, a polarization of the light beam generated by the laser 110 may be configured according to one or more experimental needs. For example, if only one NV electron spin resonance is being monitored by the system, the polarization of the light beam may be rotated to align with the NV crystal axis corresponding to that resonance. If multiple crystal axes are being monitored (e.g., monitoring of at least three of the four crystal axes of a diamond may be necessary for unique extraction of the Cartesian vector field), the light beam may be configured to provide equal polarization over all of the crystal axes being monitored.

In one or more examples, the microwave loop 122 can act as a microwave source that drives the microwave field of the system 100. Optionally, the microwave source can include microwave resonators that drive the microwave field of the system 100. In one or more examples, the microwave loop 122 may be configured to modulate the generated microwaves, such as via a solid-state switch controlled by a data acquisition system (DAQ). Modulating the generated microwaves can improve robustness of the system 100 to laser noise and/or to other external noise sources. Optionally, the MW field can be synchronized with the frame acquisition of a camera (when the photosensor 102 is a camera) to correct for laser intensity fluctuations and drift. In one or more examples, the microwave loop 122 may be configured to simultaneously drive multiple MW frequencies. The multiple MW frequencies may be selected based on the spacing of NV resonances (e.g., hyperfine resonances) of the single crystal diamond 124. Optionally, the microwave loop includes 6 mm diameter copper wire made from 320 μm diameter magnet wire.

In one or more examples, a frequency of an MW signal driven by the microwave loop 122 may be greater than or equal to 0.5 GHZ, 1 GHZ, 2 GHZ, 3 GHZ, 4 GHZ, 5 GHZ, or 10 GHz. In one or more examples, a frequency of an MW signal driven by the microwave loop 122 may be less than or equal to 0.5 GHz, 1 GHZ, 2 GHZ, 3 GHZ, 4 GHZ, 5 GHZ, or 10 GHz. In one or more examples, a frequency of an MW signal driven by the microwave loop 122 may be greater than or equal to 2 GHz and less than or equal to 4 GHz. In one or more examples, NVs in the single crystal diamond 124 may be driven with frequencies ranging from about 1 MHz to 100s of GHZ, depending on the strength and/or direction of the bias magnetic field source.

In one or more examples, the magnets 112 (of system 100 of FIG. 1A) and/or the Helmholtz coils 114 (of system 101 of FIG. 1B) can provide a bias magnetic field source of the system 100. In one or more examples, the magnets 112 may be used to apply a ~mT scale magnetic field at a chosen direction that has a different projection on all the NV axes of the single crystal diamond being analyzed. The magnets 112 can provide high stability and uniform bias fields. Optionally, the magnets 112 can be 5 cm diameter SmCo permanent magnets.

In one or more examples, one or more Helmholtz coils 114 may be used in applications in which remnant magnetization of sources inside the magnetic field-generating article 120 (e.g., inside an IC) are to be analyzed. For example, in some circuits with nickel and/or other magnetic materials incorporated in part of the fabrication process, having fine control over the magnitude and direction of the bias field may enable differentiation of the ferromagnetic and paramagnetic components of the field-generating article's magnetic field (e.g., the IC's magnetic field).

In one or more examples, a combined approach may be applied in which both the magnets 112 and Helmholtz coils 114 are simultaneously applied to generate a combined bias field. For example, one or more magnets 112 may be used to apply most of a bias magnetic field while one or more Helmholtz coils 114 may be used to create modifications/perturbations in the bias magnetic field.

In one or more examples, the photosensor 102 may comprise a complementary metal-oxide-semiconductor (CMOS), a charge-coupled device (CCD), photodiode array, and/or a single photodiode. A photodiode array and/or single photodiode may be suitable for fast sampling of the magnetic field, whereas a CMOS or CCD can be used for mapping the magnetic field onto an image. In one or more examples, a photodiode may provide a faster maximum sampling rate (e.g., about 10 MHz to about 100 MHZ) than a conventional camera (e.g., about 100s of Hz to about 10s of kHz). In one or more examples, the wavelength sensitivity of the photosensor 102 may span the range of NV fluorescence, e.g. from about 600 nm-800 nm. In one or more examples, the photosensor 102 can be communicatively connected to one or more computing devices (or other computer processors of the system 100) via a data transfer link. The data transfer link can be configured to minimize or eliminate degradation and/or delay of data captured by the photosensor 102.

In one or more examples, the photosensor 102 may be arranged with respect to the single crystal diamond 124 such that NV fluorescence from the single crystal diamond 124 is focused onto the photosensor 102 either to form an image on a camera (e.g., in the case of a CMOS, CCD, or photodiode array) or to focus onto a single photodiode. In one or more examples, the fluorescence can be measured with a low magnification microscope objective 108 (Olympus UPlanFL N 4×0.13 NA), filtered with a 633 nm longpass filter (Semrock LP02-633RU-25), and imaged onto a CMOS camera (Basler acA1920-155 um), which can relay the fluorescence information to be analyzed with software, such as LabVIEW, MATLAB, and/or python.

In one or more examples, a wide field-of-view may be enabled by a single crystal diamond 124 having a sufficiently large footprint. In one or more examples, the single crystal diamond can have a footprint of greater than or equal to 2 mm by 2 mm, 3 mm by 3 mm, 4 mm by 4 mm, or 5 mm by 5 mm. In one or more examples, the single crystal diamond 124 may extend in one or two dimensions by greater than or equal to 2 mm, 4 mm, 5 mm, 1 cm, or 2 cm. In one or more examples, the single crystal diamond 124 may extend in one or two dimensions by less than or equal to 2 mm, 4 mm, 5 mm, 1 cm, or 2 cm. In one or more examples, micron-scale and/or nanometer-scale diamonds may be used in point probe modality measurements. In one or more examples, the single crystal diamond 124 can be 4 mm×4 mm×0.5 mm.

In one or more examples, the magnetic field resolution of the system 100 can depend on the thickness of the NV layer 126 in the single crystal diamond 124. For example, if the NV layer 126 is too thick, the magnetic field images may be blurred. In one or more examples, the NV layer 126 (or layers) may be sufficiently thin to ensure that imaging is near the optical diffraction limit. In one or more examples, an NV layer 126 may be greater than or equal to 1.5 μm, 20 μm, 40 μm, 80 μm, or 100 μm in thickness. In one or more examples, the NV layer 126 may be less than or equal to 1.5 μm, 20 μm, 40 μm, 80 μm, or 100 μm in thickness. In one or more examples, the single crystal diamond 124 can have one or more NV layers of varying thickness. In one or more examples, for example in cases where an intact (e.g., not decapsulated) IC is being imaged and/or in which a distance between current sources in the magnetic field-generating article 120 and the single crystal diamond 124 are otherwise sufficiently large, thinner NV layers may be used. For example, the NV layer 126 may be thinner than the thicknesses contemplated above by a factor of 2-5.

In one or more examples, if a circuit has been prepared to minimize distance between the NV layer 126 and current traces in the circuit (e.g., a decapsulated IC), the NV layers 126 may be thin (e.g., about 100 nm to about 10 μm) to maximize spatial resolution and signal amplitude. In one or more examples, if a circuit is fully intact (or if there is otherwise a large standoff distance between the NV layer 126 and one or more current carrying traces of the IC), a thicker NV layer 126 may be used. In said cases, there may be minimal decrease in spatial resolution, but there may be increased fluorescence signal from the diamond which may improve measurements.

In one or more examples, the single crystal diamond 124 may have an isotopic purity of greater than or equal to 99.9%, 99.99%, or 99.999%. In one or more examples, a diamond having 99.999% $^{12}C$ (and 0.001% $^{13}C$) may be used. In one or more examples, a diamond having 99.95% $^{12}C$ (0.05% $^{13}C$) may be used. In one or more examples, a diamond having natural isotopic abundance (e.g., 13C 1.1%) may be used. In one or more examples, the isotope in the NV layer of the single crystal diamond can be $^{15}N$ (nuclear spin=½). Optionally, the diamond can be grown to have an isotopically pure NV layer consisting of [$^{12}C$]~99.999%, [$^{14}N$]~27 ppm, and [NV]~2 ppm.

In one or more examples, the NV density of the single crystal diamond 124 may be greater than or equal to 0.01 ppm, 0.1 ppm, 1 ppm, 10 ppm, or 100 ppm. In one or more examples, the NV density of the single crystal diamond 124 may be less than or equal to 0.01 ppm, 0.1 ppm, 1 ppm, 10 ppm, or 100 ppm. In one or more examples, the NV density of the single crystal diamond 124 may be greater than or equal to 0.1 ppm and less than or equal to 10 ppm; in one or more examples, this regime may balance the amount of NV fluorescence and the quantum coherence properties of the defects in diamond.

In one or more examples, defects in the diamond lattice of the single crystal diamond 124 may be less than or equal to 1 ppm, 0.1 ppm, or 0.01 ppm. In one or more examples, defects in the diamond lattice may be greater than or equal to 1 ppm, 0.1 ppm, or 0.01 ppm.

In one or more examples, strain in the diamond lattice of the single crystal diamond 124, in particular heterogeneous strain, may degrade quality of measurements. In one or more examples, diamonds used in the systems disclosed herein may have minimal strain gradients across the field of view. In one or more examples, fractional lattice strain in the diamond may be less than or equal to 0.00001, 0.000001, or 0.0000001. In one or more examples, fractional lattice strain in the diamond may be greater than or equal to 0.00001, 0.000001, or 0.0000001.

In one or more examples, the system may be configured and the strain in the single crystal diamond 124 may be small enough such that NV linewidth and $T_2^*$ are not significantly degraded. In one or more examples, the strain may be small enough such that linewidth broadening is less than or equal to 500 kHz, 100 kHz, or 50 kHz. In one or more examples, linewidth broadening may be greater than or equal to 500 kHz, 100 kHz, or 50 kHz. In one or more examples, the strain may be small enough such that $T_2^*$ contributions are less than or equal to 50 μs, 10 μs, 5 μs, 1 μs, or 0.5 μs. In one or more examples, the $T_2^*$ contributions may be greater than or equal to 50 μs, 10 μs, or 5 μs, 1 μs, or 0.5 μs. The total $T_2^*$ of a system may be composed of different contributions (see, e.g., Bauch, et al., Ultralong Dephasing Times in Solid-State Spin Ensembles via Quantum Control, PHYSICAL REVIEW X 8, 031025 (2018), Equation 1). In general, the different contributions to $T_2^*$ add through their inverse, so it may be desirable for the strain component to not be limiting relative all the other terms.

In one or more examples, the single crystal diamond 124 may be placed in contact with (e.g., on top of) the magnetic field-generating article 120 (e.g., an integrated circuit). In one or more examples, the single crystal diamond 124 can be placed directly on the magnetic field-generating article 120, such that the NV layer 16 contacts the surface of the magnetic field-generating article 120. In one or more examples, the single crystal diamond 124 may be placed proximate to but not in contact with the magnetic field-generating article 120 (e.g., an integrated circuit). In one or more examples, the single crystal diamond 124 may be disposed in a mount that allows for movement of the single crystal diamond 124 through a plurality of positions and/or a plurality of orientations (relative to the magnetic field-generating article and/or relative to one or more other system components). In one or more examples, the single crystal diamond 124 may be moved and/or reoriented before and/or during measurement.

In one or more examples, system 100 can enable spatial resolution of less than or equal to 10 μm, 5 μm, 1 μm, 0.5 μm, 0.1 μm, or 0.05 μm. In one or more examples, system 100 can enable spatial resolution of greater than or equal to 10

μm, 5 μm, 1 μm, 0.5 μm, 0.1 μm, or 0.05 μm. In one or more examples, system 100 can enable sub-micron spatial resolution that approaches the optical diffraction limit.

In one or more examples, system 100 can enable imaging a field of view that extends in one or two dimensions by greater than or equal to 2 mm, 4 mm, 5 mm, 1 cm, or 2 cm. In one or more examples, system 100 can enable imaging a field of view that extends in one or two dimensions by less than or equal to 2 mm, 4 mm, 5 mm, 1 cm, or 2 cm. In one or more examples, system 100 can enable imaging a field of view that is greater than or equal to 4 mm by 4 mm. In one or more examples, the field of view depends on the size of the single crystal diamond 124, such as less than or equal to the lateral dimensions of the single crystal diamond 124.

In one or more examples, system 100 can enable imaging sensitivity that is capable of detecting magnetic fields from the magnetic field-generating article that are less than or equal to 10 nT, 1 nT, 0.1 nT, 0.01 nT, 1 pT, or 0.1 pT in strength. In one or more examples, system 100 can enable imaging sensitivity that is capable of detecting magnetic fields from the magnetic field-generating article that are greater than or equal to 10 nT, 1 nT, 0.1 nT, 0.01 nT, 1 pT, or 0.1 pT in strength.

In one or more examples, one or more analysis techniques may include using fluorescence measured by the photosensor 102 based on fluorescence emission of the single crystal diamond 124 (alone and/or in combination with other data) to generate a magnetic vector field of the magnetic field-generating article 120. In one or more examples, the vector field may be a field for a single point in time. In one or more examples, the vector field may represent a time-varying vector field over a period of time. In one or more examples, the magnetic vector field may be based on the measured fluorescence and/or on data representing any one of the experimental settings (which may be referred to as "parameter settings").

As noted above, the systems of FIGS. 1A and 1B can be used to measure the fluorescence emission of a single crystal diamond to generate a magnetic vector field of a magnetic field-generating article. To measure fluorescence of the single crystal diamond, a variety of measurement protocols can be used, which can involve varying certain control parameters of the QDM system.

Figure 2:
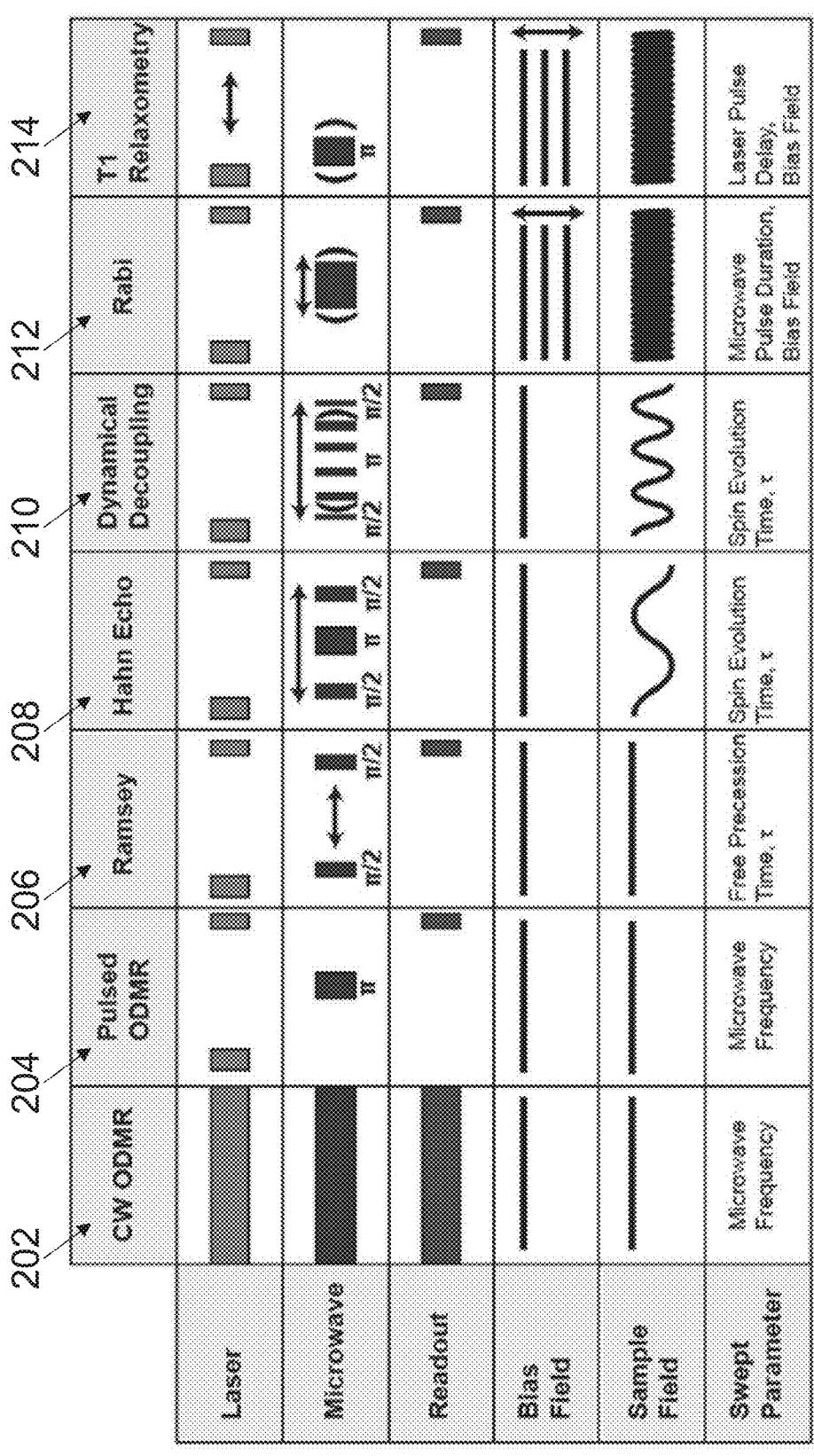
FIG. 2 is a table summarizing exemplary measurement protocols, according to one or more examples of the disclosure.

FIG. 2 shows a table depicting exemplary measurement protocols for varying control parameters of a diamond magnetometer system. In one or more examples, the exemplary measurement protocols described with reference to FIG. 2 can be implemented using the diamond microscope system 100 of FIG. 1A or the system 101 of FIG. 1B. According to one or more measurement protocols, a green (e.g., 532 nm) laser can be used for initialization and readout of the NV spin state of a single crystal diamond, a controlled external microwave (MW) or radiofrequency (RF) field can be used to drive electronic spin state transitions, an external bias magnetic field source can control the resonant frequency positions, a photosensor can read out the fluorescence of the single crystal diamond, and a control element can control each of these elements relative to one another.

The rows of the table of FIG. 2 show a variety of settings, and the columns depict a number of measurement protocols. More specifically, the settings depicted in the rows include settings related to the laser, microwave source, readout, bias field, sample field, and swept parameter (i.e., which setting is swept for the particular measurement protocol). The measurement protocols include continuous wave (CW) optically detected magnetic resonance (ODMR) 202 (depicted in the first column), pulsed ODMR 204 (second column), Ramsey 206 (third column), Hahn Echo 208 (fourth column), Dynamical Decoupling 210 (fifth column), Rabi 212 (sixth column), and $T_1$ Relaxometry 214 (seventh column).

In general, a measurement protocol may dictate any one or more experimental settings that are set and/or varied during (and/or before) measurement. Experimental settings that may be set and/or varied include (but are not limited to): MW signal power, MW signal frequency, MW signal duration, MW signal temporal pattern, MW signal coherence, MW signal spatial geometry and/or orientation, light beam power, light beam frequency, light beam signal duration, light beam temporal pattern, light beam coherence, light beam spatial geometry and/or orientation, bias magnetic field strength, bias magnetic field duration, bias magnetic field temporal patter, bias magnetic field spatial geometry and/or orientation, photosensor exposure time/pattern, photosensor sensitivity, photosensor spectral range, photosensor orientation, crystal diamond location, crystal diamond orientation, environmental humidity, environmental temperature, ambient light, other environmental factors, magnetic field-generating article position, magnetic field-generating article orientation, magnetic field-generating article operational state (e.g., whether current is passing through the magnetic field-generating article, including whether a known current (e.g., as generated by an external function generator) is being passed through one or more predetermined wires in the article and/or including whether the magnetic field-generating article is executing one or more computer programs (e.g., in the case where the article is a circuit)), and/or magnetic-field generating article sample field (e.g., the magnetic field generated by the article, which is to be measured). In one or more examples, any one or more experimental settings may be set and/or varied over time during a period immediately preceding and/or coinciding with measuring fluorescence emission from the single crystal diamond. In one or more examples, any one or more experimental settings may be controlled by an automated control system of the systems disclosed herein, for example by being controlled by one or more computing devices and/or other computer processors.

As used herein, the term "sweep" or "swept" may refer to any variation or configuration of experimental settings. Thus, a measurement protocol that involves "sweeping" an experimental setting such as laser power can involve varying the power of the laser. In one or more examples, an experimental setting can be varied before, during, and/or after the period when fluorescence signal is being measured.

In one or more examples, different measurement protocols can be used to measure different characteristic magnetic field emanations by the IC at different frequencies. To measure low-frequency, broadband magnetic fields, CW ODMR 202, pulsed ODMR 204, and/or Ramsey 206 protocols may be used. To measure high-frequency, narrowband magnetic fields, Dynamical Decoupling 210 (e.g., Hahn Echo 208 and CPMG), Rabi 212, and/or $T_1$ Relaxometry 214 protocols can be used.

A CW ODMR 202 protocol can involve simultaneously exciting a single crystal diamond, controlling the MW source, and reading the red fluorescence emanating from the single crystal diamond. In this method, the red NV fluorescence can be optically monitored (such as via a photosensor) as the frequency of the external MW control field is swept. When the external MW frequency is resonant with a given NV electronic spin state transition, the fluorescence decreases. Through monitoring the position of the resonance frequency (the line-center of the Lorentzian profile that defines the resonance), one can measure the external magnetic field. This method is broadband and sensitive to fields slower than the time it takes to repeat measurements of the fluorescence and is ultimately limited by how fast the NV can be optically pumped (~MHz).

Extensions of this technique include vector magnetic field measurements and "lock-in" measurements. In vector magnetic field measurements, an external bias field is aligned such that the position of all 8 resonance groupings (8=4 crystal axes, and 2 transitions for $m_s=0 \leftrightarrow m_s=1$ and $m_s=0 \leftrightarrow -1$) can be monitored. Through "lock-in" measurements, a sparse list of MW resonance frequencies are chosen which are maximally sensitive to changes in an external magnetic field. As will be discussed below, a digital lock-in measurement protocol can be implemented wherein a small number (such as one or two) of MW resonance frequencies are selected and a relative magnetic field is determined based on the magnetic-field dependent fluorescence of the diamond as a function of the selected MW resonance frequencies.

Generally, higher intensity laser light and higher power MWs are desirable to increase fluorescence and measurement contrast. One downside of CW ODMR 202 is that the simultaneous application of lasers and microwaves while sensing magnetic fields spoils some the spin relaxation and spin dephasing properties of the NVs.

Pulsed ODMR 204 temporally separates the spin initialization, MW driving, and readout, thereby allowing for the use of high optical intensity without spoiling the NV properties. This process is repeated rapidly for each individual measurement. When sensing magnetic fields, the microwave frequency is swept and the resonance frequency is extracted.

Rather than sensing magnetic fields based on the determination of a resonance frequency, Ramsey 206 magnetometry is the first of a class of protocols that utilize phase accumulation and preparation of different spin states to sense magnetic fields. Following initialization of the NV spin state into the $m_s=0$ state with the application of green laser pulse, a calibrated MW pulse is applied to create a superposition of the $m_s=0$ and $m_s=-1$ or the $m_s=0$ and $m_s=+1$ spin state (when operating in the "Single Quantum" basis.) The $m_s=0$ state and the $m_s=\pm1$ acquire phase at different rates. At the end of the sensing time, t, the accumulated phase difference is projected onto the NV population with another calibrated MW pulse. This spin state population difference is read out through the intensity of red fluorescence. The speed in sensing external magnetic fields is limited by how fast this process can be repeated (can be ~100 kHz-1 MHZ). Repeatability is normally limited by optimal green pulse times and sensing duration t. The optimal sensing duration is generally in the neighborhood of the spin sensing time, $T_2^*$.

An extension enabled by Ramsey 206 magnetometry is operating in the "Double Quantum" basis which is doubly sensitivity to magnetic fields and robust to changes in temperature and the effects of strain. In this double quantum basis, the NV electronic spin state is prepared in a superposition of the $m_s=-1$ and $m_s=+1$ spin state.

CW ODMR 202, pulsed ODMR 204 and Ramsey 206 protocols belong to the class of DC Magnetometry techniques, which are sensitive to fields slower than the sampling rate, analogous to an oscilloscope-like protocol. In contrast, Hanh Echo 208, Dynamical Decoupling 210, Rabi 212, and $T_1$ Relaxometry 214 protocols belong to the class of AC Magnetometry techniques, which are sensitive to higher frequency magnetic fields, but only responsive to narrow frequencies around a given center frequency.

The Hahn Echo 208 protocol is similar to the Ramsey 206 protocol except that an additional calibrated MW pulse, known as a pi pulse is applied in the middle of the MW sequence. This pi pulse reverses the direction of phase accumulation, which can cancel out the influence of magnetic fields more slowly than the spacing between pulses. This cancellation of slow fields enables sensing times out to the spin decoherence time $T_2$ ($T_2 > T_2^*$.)

Dynamical Decoupling 210 adds multiple pi pulses in the MW sequence, which can restrict the spread of frequencies to which the NV is sensitive. This allows the extension of the $T_2$ time and can enable high sensitivity measurements of a specific frequency band. There is a large class of measurements under this category that depends on the phase relationship between different pi pulses.

Rabi 212 is most analogous to contrast imaging, however, it is done in a coherent modality. Rather than looking at how the application of MW and RF fields alter the contrast of the ODMR feature (contrast imaging/protocol), Rabi protocols measure the coherent population transfer between the $m_s = 0$ and $m_s = \pm 1$. Electronic spin state population is transferred coherently back and forth between the spin states and the rate of this transfer is linearly proportional to the amplitude of the external MW field. This method is applicable for sensing fast external magnetic fields (~100 MHz->10 GHz.)

The protocol for $T_1$ Relaxometry 214 differs than the other techniques discussed. Rather than probing electronic spin transition locations and phase accumulation, $T_1$ measurements probe the delay in the purity of the initialized spin state after an optical initialization pulse. After being initialized into the $m_s = 0$ state with an intense green pulse, the NV spin state will decay into a mixed state with equal populations of spin states at a characteristic time $T_1$ (spin relaxation time, $T_1 \sim m_s$ timescale.) The presence of high frequency magnetic fields can accelerate this decay. Through probing differences in this decay, one can determine the presence of external high frequency fields.

It will be appreciated that various analysis techniques may be used in conjunction with these exemplary measurement protocols, including PCR, SCA, and other techniques known in the art.

Figure 3:
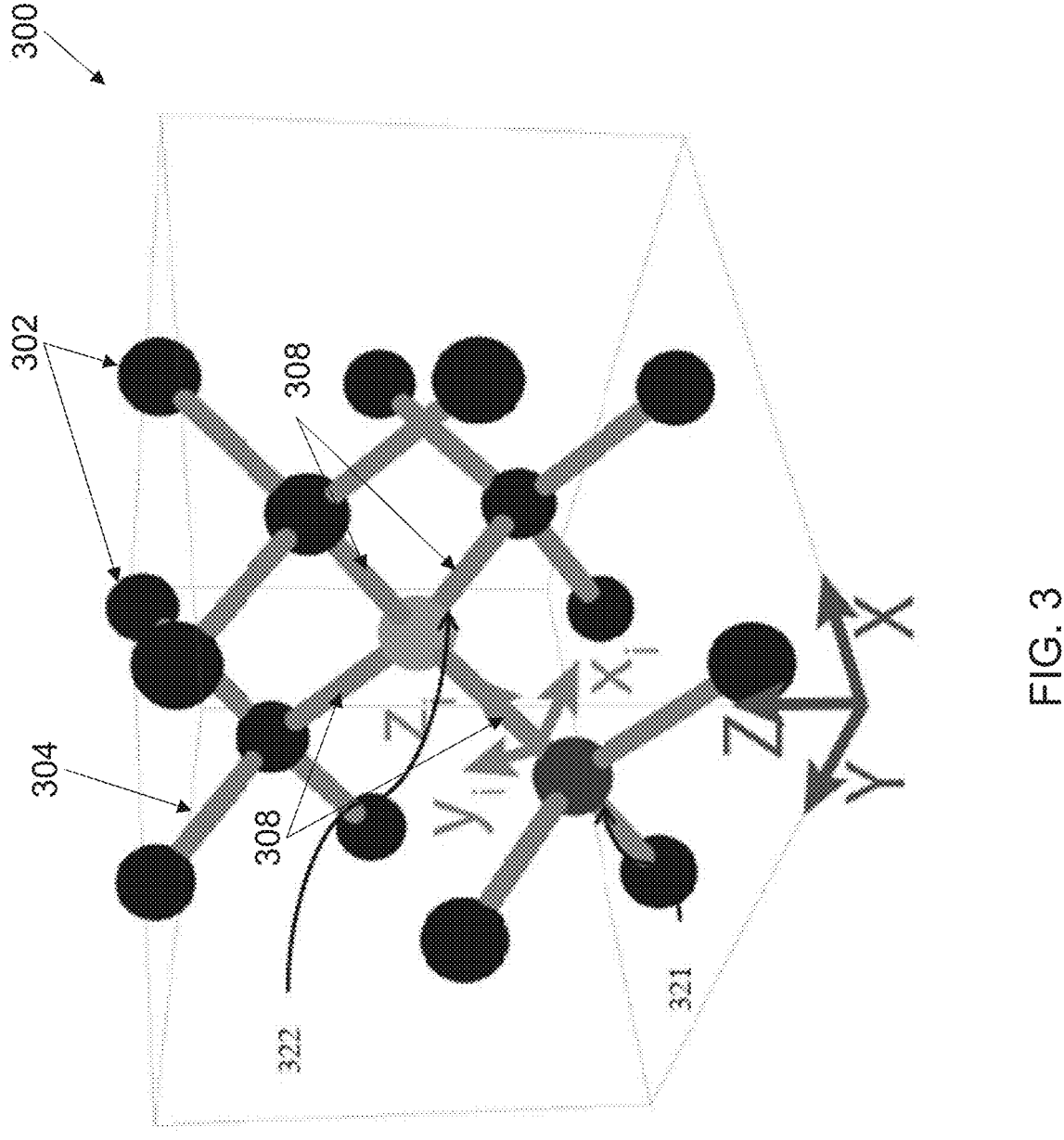
FIG. 3 shows an exemplary crystal diamond lattice with a nitrogen-vacancy defect, according to one or more examples of the disclosure.

As noted above, the measurement protocols of FIG. 2 and the systems 100 of FIG. 1A and system 101 of FIG. 1B can rely on a single crystal diamond with a nitrogen-vacancy defect. FIG. 3 shows an exemplary crystal diamond lattice 300 with a nitrogen-vacancy defect according to one or more examples of the disclosure. As shown, the diamond lattice 300 includes a number of carbon atoms 302 joined by covalent bonds 304. The diamond lattice 300 also includes a nitrogen atom 321 located adjacent a vacancy 322 (e.g., a defect). Lab frame coordinates (X,Y,Z) and NV frame coordinates ($X_i, Y_i, Z_i$) for the vacancy 322 are shown. As shown, the vacancy 322 has four NV axes 308 (also called "symmetry axes"), which can be leveraged for vector magnetic field imaging using bias magnetic field ($B_0$) projection onto all four NV axes 308.

Figure 4:
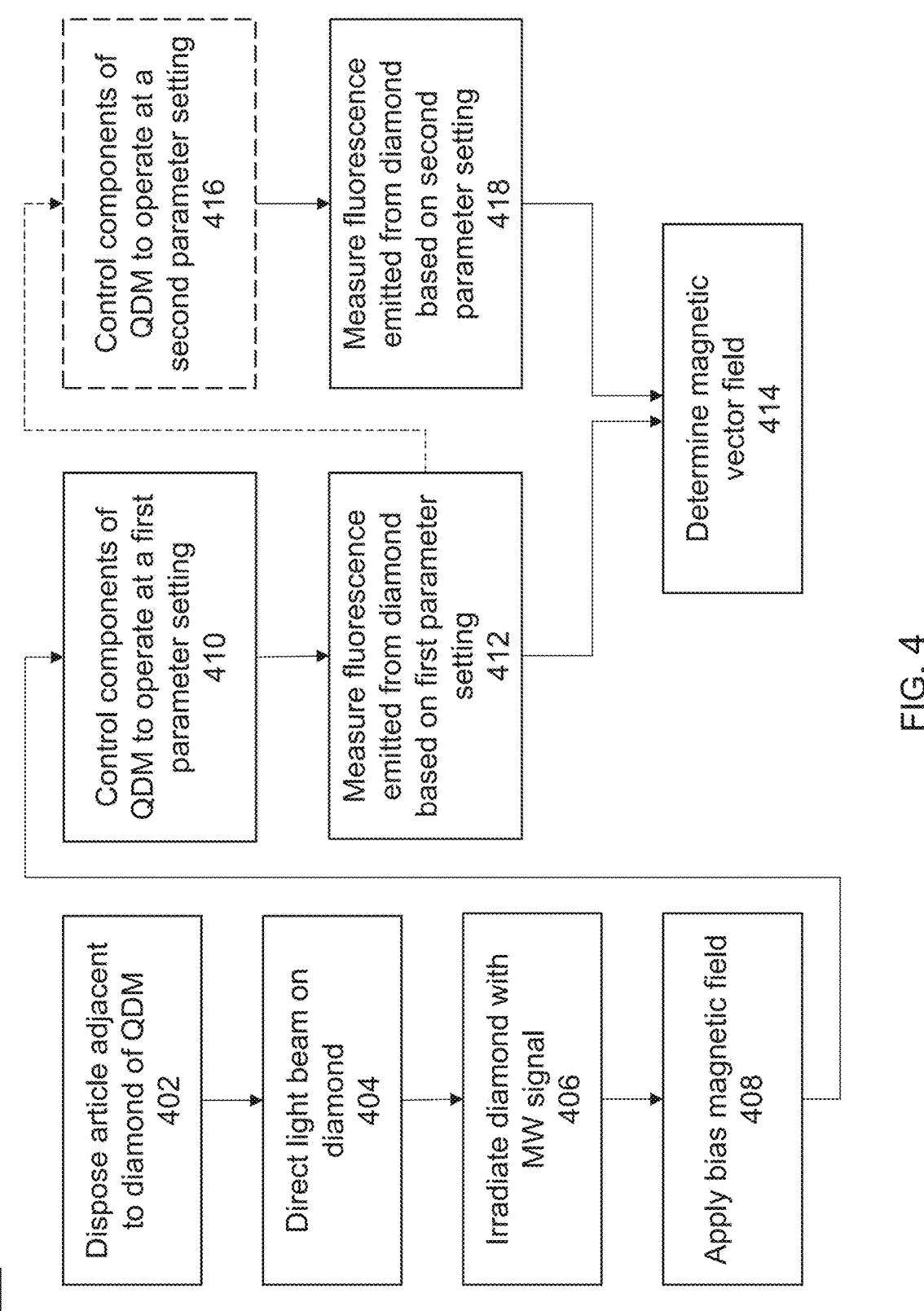
FIG. 4 illustrates an exemplary method for determining the relative magnetic field of a magnetic field-generating article using a digital lock-in measurement protocol, according to one or more examples of the disclosure.

As discussed above, a single crystal diamond with a NV defect in a QDM system (such as the systems 100 and 101 of FIGS. 1A-B, respectively) can be used to measure fluorescence emissions in order to generate the magnetic vector field of a magnetic field-generating article, such as an IC. FIG. 4 illustrates an exemplary method 400 for determining the relative magnetic field of a magnetic field-generating article using a digital lock-in measurement protocol, according to one or more examples of the disclosure. The method 400 can be performed using a QDM system (such as system 100 of FIG. 1A, or system 101 of FIG. 1B), that includes a light source (such as an excitation laser), a microwave source (such as a microwave loop), and a magnetic field source (such as permanent magnets and/or Helmholtz coils), as well as a photosensor to measure the fluorescence of a single crystal diamond that contains an NV layer. According to one or more measurement protocols, a green (e.g., 532 nm) laser can be used for initialization and readout of the NV spin state of the single crystal diamond, an external MW or RF field can be used to drive electronic spin-state transitions of the NV layer, an external bias magnetic field source can control the NV electron spin resonant frequency positions, and a photosensor (such as a camera) can measure the fluorescence of the single crystal diamond. Optionally, a control element (such as a controller) can control each of the light source, microwave source, and magnetic field sources to vary the three driving fields—optical, MW, and bias magnetic—to manipulate the NV electronic- and spin-state populations of diamond in a controlled manner. As explained above, a single crystal diamond with an NV layer can exhibit fluorescence indicative of the magnetic field of a magnetic-field generating article. Accordingly, the method 400 can be used to control the NV electronic- and spin-state populations of diamond in a QDM system, measure the magnetic field-dependent fluorescence of the diamond, and to determine the magnetic vector field of a magnetic-field generating article.

In one or more examples, method 400 begins at step 402, wherein a magnetic field-generating article is disposed adjacent to the diamond of the QDM. In one or more examples, the diamond of method 400 is a single-crystal diamond (e.g., a diamond substrate like the single crystal diamond 124 of FIGS. 1A-B) that contains an NV layer (like the NV layer 126 of FIGS. 1A-B). The magnetic field-generating article (e.g., an IC device) can be positioned immediately adjacent to the single crystal diamond. In one or more examples, disposing the magnetic-field generating article adjacent to diamond at step 402 can include placing a single crystal diamond substrate directly on the magnetic field-generating article such that the NV layer of the diamond substrate contacts the surface of the magnetic field-generating article.

In one or more examples, after disposing the article adjacent to diamond at step 402, the method 400 moves to step 404 wherein a light beam is directed on the diamond. The light beam can be generated by a coherent light source, such as a laser, that is configured to drive the optical field of the QDM system. In one or more examples, the light beam can be tuned such that an incident angle of the light beam achieves total internal reflection within the single crystal diamond to minimize direct illumination of the magnetic field-generating article.

In one or more examples, after directing the light beam on the diamond at step 404, the method 400 can move to step 406, wherein the diamond is irradiated with a MW signal. The MW signal can be generated via a microwave source, such as a microwave loop (e.g., the microwave loop 122 of FIG. 1), that is configured to drive the MW field of the QDM system. In one or more examples, the microwave source can include microwave resonators that drive the microwave field of the QDM system. In one or more examples, irradiating the diamond with a MW signal may rely on a solid-state switch controlled by a data acquisition unit (DAQ) that is configured to modulate the MW signal. Optionally, the MW signal may be synchronized with the frame acquisition of a camera to correct for laser intensity fluctuations and drift. In one or more examples, step 406 can be performed before step 404, or simultaneously with performing step 404.

In one or more examples, after irradiating the diamond at step 406, the method 400 can move to step 408, wherein a bias magnetic field is applied to the diamond. The bias magnetic field can be generated via a magnetic field source, such as permanent magnets (e.g., magnets 112 of FIG. 1A) and/or Helmholtz coils (e.g., Helmholtz coils 114 of FIG. 1B), that is configured to drive the bias magnetic field of the QDM system. In one or more examples, applying a bias magnetic field at step 408 can include applying a ~mT scale magnetic field at a chosen direction with a different projection on all the NV axes of the single crystal diamond. Optionally, applying the bias magnetic field at step 408 can include utilizing both magnets and Helmholtz coils to generate a combined bias field. In one or more examples, step 408 can be performed before or simultaneously with one or more of steps 404 and 406. Thus, it should be understood that the progression of step 404 followed by step 406 and then step 408 is provided for example only, as these steps may be performed in an alternate order or simultaneously.

In one or more examples, after applying the bias magnetic field at step 408, the method 400 can move to step 410, wherein components of the QDM system are controlled to operate at a first parameter setting. As used herein, "parameter setting," indicates a particular combination of settings of the light source, MW source, and the bias magnetic field source. As noted above, experimental settings that can be set and/or varied include, but are not limited to, MW signal power, MW signal frequency, MW signal duration, MW signal temporal pattern, etc. Thus, a first parameter setting can include a combination of experimental settings, such as a particular light beam frequency, MW signal frequency, and bias magnetic field strength. Parameter settings of components of the QDM can be controlled using one or more computing devices, as will be discussed below.

In one or more examples, after controlling components of the QDM system to operate at the first parameter setting at step 410, the method 400 can move to step 412, wherein the fluorescence emitted from the diamond based on the first parameter setting is measured. As noted above, the fluorescence emitted from the diamond can be impacted by the article placed adjacent to the diamond at step 402. Prior to measuring the fluorescence emitted from the diamond at step 412, the article can be configured into an operation mode such that the article impacts the magnetic-field dependent fluorescence emitted from the diamond. For instance, if the article is an IC device, the IC can be configured into an operation mode by electrical connection, computer control, and/or physical manipulation such that current is passing through the IC device, such that current is passing through one or more predetermined wires in the article, and/or such that the IC device executes one or more computer programs (for instance, if the IC device is a circuit). Thus, measuring the fluorescence emitted by the diamond at step 412 can include measuring fluorescence emitted by the diamond that is being impacted by the magnetic field of the article disposed adjacent to the diamond.

Measuring the fluorescence emitted by the diamond at step 412 can be performed using a photosensor such as a CMOS, CCD, photodiode array, and/or single photodiode. As noted above, a CMOS or CCD can be used to read out the fluorescence of the diamond and map the magnetic field of a magnetic field-generating article onto an image. Thus, in one or more examples, measuring the fluorescence at step 412 can be performed using a CMOS or CCD. In one or more examples, measuring the fluorescence emitted from the diamond can be controlled using one or more computing device, such as a device that can control the photosensor to measure fluorescence.

In one or more examples, the method 400 can include step 416, wherein components of the QDM system are controlled to operate at a second parameter setting. The second parameter setting is distinct from the first parameter setting of step 410. Thus, in one or more examples, the method 400 involves controlling the components of the QDM to operate a first parameter setting (step 410) and controlling the components of the QDM to operate at a distinct second parameter setting (step 416). Optionally, the method 400 can first control the components to operate at the first parameter setting (step 410) before controlling the components to operate at the second parameter setting (step 416).

In one or more examples, after controlling components of the QDM system to operate at the second parameter setting at step 416, the method 400 can move to step 418, wherein the fluorescence emitted from the diamond based on the second parameter setting is measured. Measuring the fluorescence emitted by the diamond at step 418 can be performed in the same manner as measuring the fluorescence emitted by the diamond at step 412. For instance, a CMOS or CCD can be used to read out the fluorescence of the diamond and map the magnetic field of the magnetic field-generating article onto an image. In one or more examples, measuring the fluorescence emitted from the diamond can be controlled using one or more computing devices, such as a device that can control the photosensor to measure fluorescence. As above with respect to step 412, prior to measuring the fluorescence emitted from the diamond at step 418, the article can be configured into an operation mode such that the article impacts the magnetic-field dependent fluorescence emitted from the diamond. Thus, measuring the fluorescence emitted by the diamond at step 418 can include measuring fluorescence emitted by the diamond that is being impacted by the magnetic field of the article disposed adjacent to the diamond.

In one or more examples, after measuring fluorescence emitted from the diamond (e.g., at one or more both steps 412 and 418), the method 400 moves to step 414, wherein the magnetic vector field of the magnetic field-generating article is determined. Where the method 400 includes only a first parameter setting (e.g., steps 410 and 412), determining a magnetic vector field at step 414 can include subtracting the fluorescence measurements obtained at step 412 from ambient background (e.g., a baseline fluorescence measurement). An ambient background measurement may be obtained by measuring the fluorescence of the diamond when the article is not disposed adjacent the diamond (e.g., when the emission is not impacted by the magnetic field effects of the article being adjacent to the diamond) and/or when the article is not configured into an operation mode in which the article impacts the magnetic-field dependent fluorescence emitted from the diamond. Where the fluorescence measurements obtained at step 412 are in the form of an image, the image can be subtracted (on a pixel by pixel basis) from an image depicting a baseline fluorescence measurement of the diamond without the article impacting the magnetic field-dependent fluorescence emitted from the diamond to determine the magnetic vector field relative to ambient. Where the method 400 includes both a first parameter setting and a second parameter setting (e.g., steps 410, 412, 416, and 418), determining a magnetic vector field at step 414 can include subtracting the fluorescence measurements obtained at step 412 from the fluorescence measurements obtained at step 418 (or vice versa) to obtain a relative magnetic vector field between the first parameter setting and the second parameter setting. In one or more examples, the process of determining a relative magnetic vector field relative to ambient or between two parameter settings can be referred to as "post-processing digital lock-in."

Figure 5:
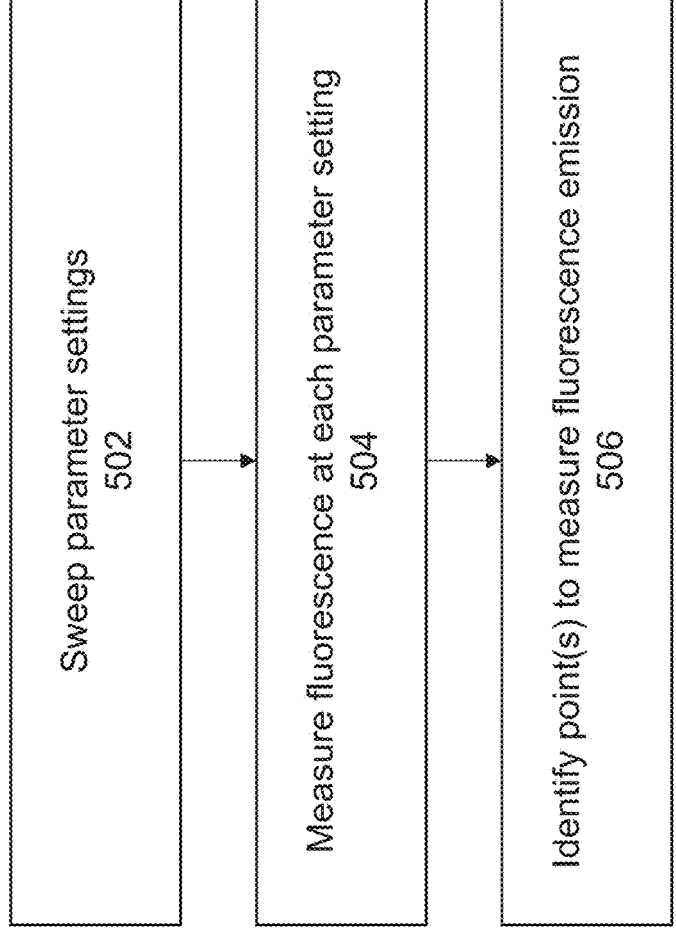
FIG. 5 illustrates an exemplary method for selecting parameter settings at which to determine the relative magnetic field of a magnetic field-generating article, according to one or more examples of the disclosure.

In one or more examples, implementing method 400 can include an additional method for selecting particular parameter settings at which to control the components of the QDM system to operate (e.g., a method for selecting one or more of the first parameter setting of step 410 and the second parameter setting of step 416). FIG. 5 shows a flowchart illustrating an exemplary method 500 for selecting parameter settings. Method 500 can be implemented to select parameter settings at which the diamond is maximally sensitive to changes in an external magnetic field in order to measure fluorescence emitted from the diamond with decreased data collection time. In one or more examples, method 500 can be implemented as part of method 400 to select one or more of the first parameter setting of step 410 and the second parameter setting of step 416. For instance, method 500 can be performed before disposing an article adjacent to the diamond of a QDM at step 402, or before configuring the article into an operational mode to measure the magnetic field-dependent fluorescence emitted from the diamond.

In one or more examples, the method 500 begins at step 502, wherein parameter settings of components of the QDM system are swept. Sweeping (e.g., varying) components of the QDM system can be performed by controlling the components to operate at a number of parameter settings. Optionally, sweeping parameter settings can be performed using a CW ODMR protocol to measure red NV fluorescence while sweeping frequency of the external MW control field. Other measurement protocols, as discussed above, can also be utilized to sweep parameter settings of the QDM system components at step 502.

In one or more examples, while sweeping the parameter settings at step 502, the method 500 includes step 504 wherein the fluorescence of the diamond is measured at each parameter setting being swept at step 502. For instance, where the parameter setting being varied is MW signal frequency, the MW signal frequency can be varied across a number of values and the fluorescence of the diamond can be measured at each of those MW signal frequency values. As noted above, a photodiode can provide a faster sampling rate (e.g., about 10 MHz to about 100 MHz) than a conventional camera (e.g., about 100s of Hz to about 10s of kHz). Accordingly, in one or more examples, a fluorescence measured for the purpose of identifying a particular parameter setting can be measured via a photodiode array and/or a single photodiode (e.g., for fast sampling of magnetic field). In one or more examples, sweeping parameter settings (e.g., step 502) and measuring fluorescence (e.g., step 504) at those settings can be performed quickly, such as in near real time.

At step 506, the particular parameter settings (e.g., the first parameter setting of step 410 and the second parameter setting of step 416), can be identified based on the fluorescence measured at step 504. In one or more examples, an optically-detected magnetic resonance (ODMR) spectrum (e.g., fluorescence as a function of MW frequency) can be measured based on the average fluorescence signal measured across the diamond. MW frequencies may then be selected based on the point of the ODMR spectrum in which the NV electron spin resonance features exhibit maximum slope in their intensities. In one or more examples, the point of maximum slope can be identified by plotting the derivative of the ODMR spectrum and identifying a point (or multiple points) in which the derivative is maximum or minimum. The point(s) of maximum change correspond to MW frequencies that can be applied to the diamond which will yield fluorescence intensities most sensitive to magnetic fields from the sample under test (e.g., corresponding to parameter settings best suited to provide robust magnetic field information when measured at steps 412 and/or 418). Where multiple parameter settings are used in method 400, the above process can be used to identify multiple MW frequencies at the points of greatest slope in the ODMR spectra (e.g., two points that exhibit the most change).

Figure 6:
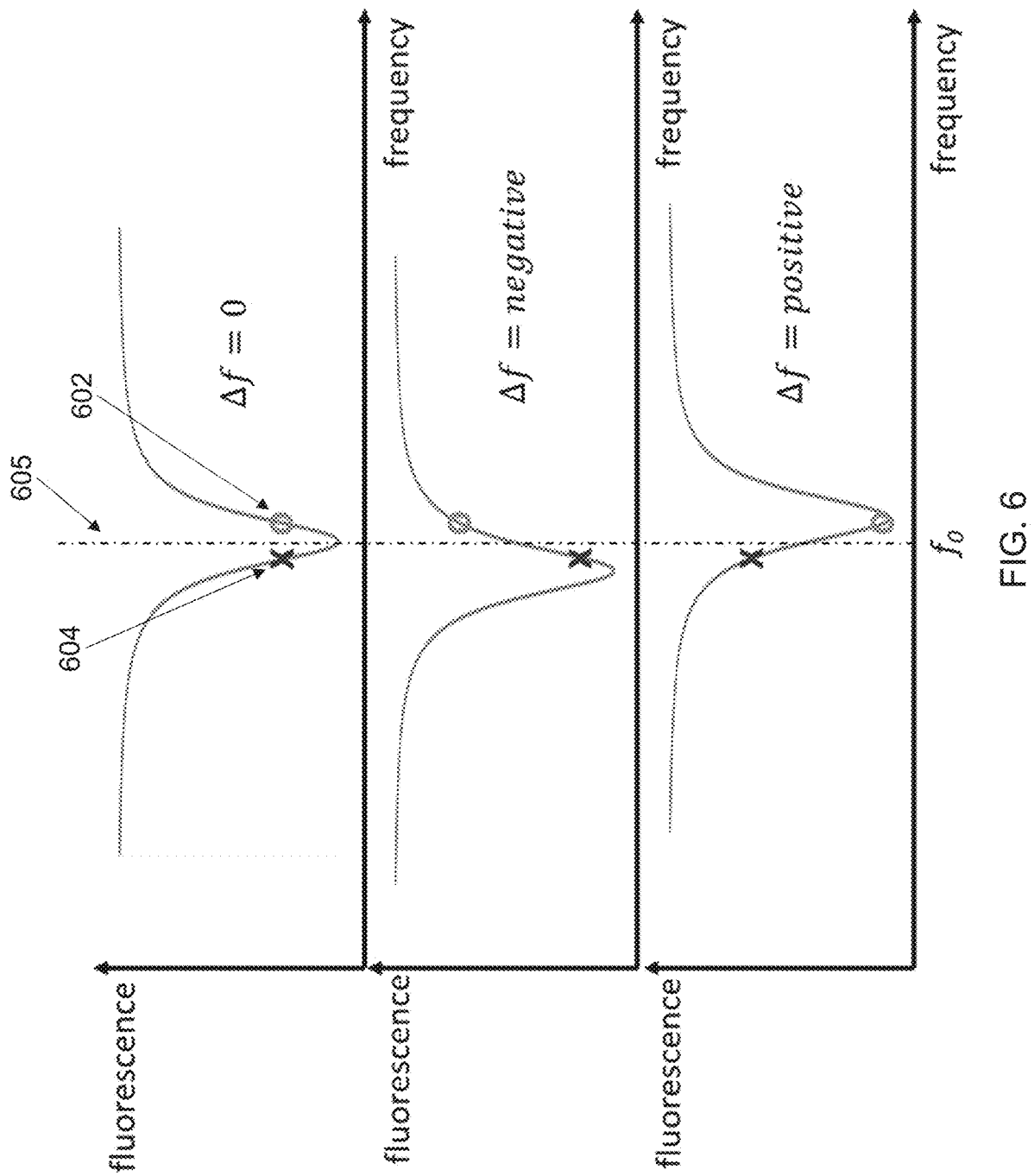
FIG. 6 graphically depicts the post-processing lock-in technique for optically detected magnetic resonance spectroscopy, according to one or more examples of the disclosure.

FIG. 6 graphically depicts the post-processing digital lock-in technique for optically detected magnetic resonance spectroscopy, according to one or more examples of the disclosure. As shown, two MW frequencies, 602 and 604, are selected at the point of maximum slope on the ODMR curve shown in the center plot of FIG. 6 when only the bias magnetic field is applied. In follow-on measurements when the NV centers interact with the test article, only the selected MW frequencies 602 and 604 may be applied while monitoring the NV fluorescence. The magnetic fields from the test article can shift the NV spin resonances in the ODMR curve (e.g., the dip in the curves). For instance, the middle plot shows the NV spin resonance shifted to lower frequencies relative to the top plot (the dip in the curve has shifted to the left of the dotted line 605). The bottom plot shows the NV spin resonance has shifted to higher frequencies relative to the top plot (the dip in the curve has shifted to the right of the dotted line 605).

As the magnetic fields from the test article shift the NV spin resonances, the selected MW frequencies 602 and 604 shift up and down relative to each other. For instance, as shown in middle plot, the NV fluorescence intensity at MW frequency 602 is greater than the fluorescence intensity at MW frequency 604, implying that the NV spin resonance has shifted to a lower frequency relative to the top plot, which is shown by the shift of the curve to the left of the dotted line 605. The relationship between the fluorescence intensities of the MW frequencies 602 and 604 can then be used to determine the relative magnetic field of the magnetic field-generating article. For instance, a pixel-by-pixel comparison of the relative differences between the NV fluorescence intensities at the selected MW frequencies 602 and 604 across the diamond chip can provide a means for localizing relative changes in the magnetic field caused by the test article.

Figure 7:
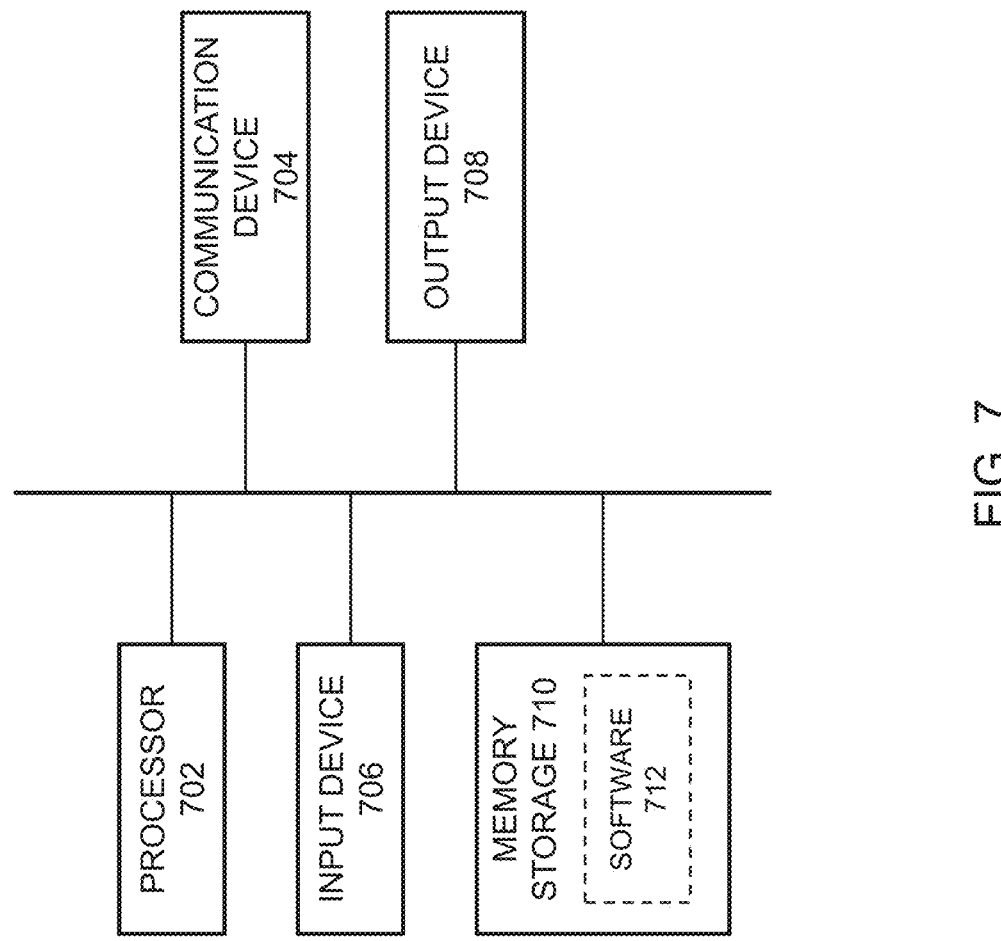
FIG. 7 depicts a computing device, according to one or more examples of the disclosure.

FIG. 7 depicts a computing device 700, according to one or more examples of the disclosure. In one or more examples, device 700 can be used to control one or more components of a QDM system, such as the system 100 of FIG. 1A or the system 101 of FIG. 1B. In one or more examples, device 700 can implement a method for computing the relative magnetic field of a magnetic field-generating article, such as method 400 of FIG. 4, and/or a method for selecting parameter settings at which to compute the relative magnetic field of a magnetic field-generating article, such as method 500 of FIG. 5.

Device 700 can be a host computer connected to a network. Device 700 can be a client computer or a server. As shown in FIG. 7, device 700 can be any suitable type of microprocessor-based device, such as a personal computer, workstation, server, or handheld computing device (portable electronic device) such as a phone or tablet. The device can include, for example, one or more of processors 702, input device 706, output device 708, storage 710, and communication device 704. Input device 706 and output device 708 can generally correspond to those described above and can either be connectable or integrated with the computer.

Input device 706 can be any suitable device that provides input, such as a touch screen, keyboard or keypad, mouse, or voice-recognition device. Output device 708 can be any suitable device that provides output, such as a touch screen, haptics device, or speaker.

Storage 710 can be any suitable device that provides storage, such as an electrical, magnetic, or optical memory, including a RAM, cache, hard drive, or removable storage disk. Communication device 704 can include any suitable device capable of transmitting and receiving signals over a network, such as a network interface chip or device. The components of the computer can be connected in any suitable manner, such as via a physical bus or wirelessly.

Software 712, which can be stored in storage 710 and executed by processor 702, can include, for example, the programming that embodies the functionality of the present disclosure (e.g., as embodied in the devices as described above).

Software 712 can also be stored and/or transported within any non-transitory computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 710, that can contain or store programming for use by or in connection with an instruction execution system, apparatus, or device.

Software 712 can also be propagated within any transport medium for use by or in connection with an instruction execution system, apparatus, or device, such as those described above, that can fetch instructions associated with the software from the instruction execution system, apparatus, or device and execute the instructions. In the context of this disclosure, a transport medium can be any medium that can communicate, propagate, or transport programming for use by or in connection with an instruction execution system, apparatus, or device. The transport readable medium can include, but is not limited to, an electronic, magnetic, optical, electromagnetic, or infrared wired or wireless propagation medium.

Device 700 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Device 700 can implement any operating system suitable for operating on the network. Software 712 can be written in any suitable programming language, such as C, C++, Java, or Python. In various embodiments, application software embodying the functionality of the present disclosure can be deployed in different configurations, such as in a client/ server arrangement or through a Web browser as a Web-based application or Web service, for example.

The foregoing description, for the purpose of explanation, has been described with reference to specific examples. However, the illustrative discussions above are not intended to be exhaustive or to limit the invention to the precise forms disclosed. Many modifications and variations are possible in view of the above teachings. The examples were chosen and described in order to best explain the principles of the techniques and their practical applications. Others skilled in the art are thereby enabled to best utilize the techniques and various examples with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims.

The invention claimed is:

1. A system, comprising:
   a memory;
   one or more processors;
   wherein the memory stores one or more programs that when executed by the one or more processors, cause the one or more processors to:
   control a plurality of components to operate at a first parameter setting, the plurality of components comprising:
   a coherent light source configured to generate a light beam directed at a single crystal diamond, the single crystal diamond having a plurality of NV centers and configured to generate fluorescence in response to being illuminated by the coherent light source;
   a microwave (MW) radiation source configured to irradiate the single crystal diamond with a MW signal;
   a magnetic field source configured to apply a bias magnetic field to the single crystal diamond; and
   a photosensor configured to measure the fluorescence generated by the single crystal diamond;
   measure the fluorescence emitted from the single crystal diamond based on the first parameter setting, wherein the fluorescence emitted is impacted by a magnetic field-generating article disposed adjacent the single crystal diamond; and
   determine a relative magnetic vector field of the magnetic field-generating article based on the measured fluorescence emitted from the single crystal diamond based on the first parameter setting.

2. The system of claim 1, wherein the one or more programs when executed by the one or more processors cause the one or more processors to:
   control the plurality of components to operate at a second parameter setting;
   measure the fluorescence emitted from the single crystal diamond based on the second parameter setting; and
   determine the relative magnetic vector field of the magnetic field-generating article based on the measured fluorescence emitted from the single crystal diamond based on the first parameter setting and the second parameter setting.

3. The system of claim 1, wherein the one or more programs when executed by the one or more processors, cause the one or more processors to acquire a baseline fluorescence measurement, wherein acquiring the baseline fluorescence measurement comprises measuring the fluorescence emitted by the single crystal diamond when the fluorescence emitted is not impacted by the magnetic field-generating article.

4. The system of claim 3, wherein the one or more programs when executed by the one or more processors cause the one or more processors to determine the relative magnetic vector field of the magnetic field-generating article based on the measured fluorescence signal emitted from the single crystal diamond based on the first parameter setting and the baseline fluorescence measurement.

5. The system of claim 1, wherein the one or more programs when executed by the one or more processors cause the one or more processors to select the first parameter setting, wherein selecting the first parameter setting comprises:

controlling the plurality of components to operate at a plurality of parameter settings;

measuring the fluorescence emitted from the single crystal diamond based on a plurality of the plurality of parameter settings, wherein the fluorescence emitted is not impacted by the magnetic field-generating article generating an optically-detected magnetic resonance (ODMR) spectrum based on the measured fluorescence emitted from the single crystal diamond at the plurality of the plurality of parameter settings; and selecting the first parameter setting based on the generated ODMR spectrum.

6. The system of claim 5, wherein selecting the first parameter setting based on the generated ODMR spectrum comprises identifying one of the plurality of fluorescence signals wherein the ODMR spectrum has a maximum slope.

7. The system of claim 5, wherein the plurality of parameter settings correspond to values of one or more of MW signal power, MW signal frequency, MW signal duration, and the strength of the bias magnetic field.

8. The system of claim 5, wherein the plurality of parameter settings correspond to values of one or more of a position of the single crystal diamond relative to the magnetic field-generating article and an orientation of the single crystal diamond relative to the magnetic field-generating article.

9. The system of claim 1, wherein the photosensor comprises one or more selected from the group of: a CMOS, a CCD, a photodiode array, and a single photodiode.

10. The system of claim 1, wherein the coherent light source comprises a laser.

11. The system of claim 1, wherein the microwave source comprises one or more microwave resonators or a microwave loop.

12. The system of claim 1, wherein the magnetic field source comprises one or more Helmholtz coils and/or one or more permanent magnets.

13. A method comprising:

controlling a plurality of components to operate at a first parameter setting, wherein the plurality of components comprise:

a coherent light source configured to generate a light beam directed at a single crystal diamond, the single crystal diamond having a plurality of NV centers and configured to generate fluorescence in response to being illuminated by the coherent light source;

a microwave (MW) radiation source configured to irradiate the single crystal diamond with a MW signal; and a magnetic field source configured to apply a bias magnetic field to the single crystal diamond;

measuring the fluorescence emitted from the single crystal diamond based on the first parameter setting using a photosensor; and determining a relative magnetic vector field of a magnetic field-generating article based on the measured fluorescence emitted from the single crystal diamond based on the first parameter setting.

14. The method of claim 13, comprising:

controlling the plurality of components to operate at a second parameter setting;

measuring the fluorescence emitted from the single crystal diamond based on the second parameter setting; and determining the relative magnetic vector field of the magnetic field-generating article based on the measured fluorescence emitted from the single crystal diamond based on the first parameter setting and the second parameter setting.

15. The method of claim 13, comprising acquiring a baseline fluorescence measurement, acquiring the baseline fluorescence measurement comprises measuring the fluorescence emitted by the single crystal diamond when the fluorescence emitted is not impacted by the magnetic field-generating article.

16. The method of claim 15, comprising determining the relative magnetic vector field of the magnetic field-generating article based on the measured fluorescence signal emitted from the single crystal diamond based on the first parameter setting and the baseline fluorescence measurement.

17. The method of claim 13, comprising selecting the first parameter setting, wherein selecting the first parameter setting comprises:

controlling the plurality of components to operate at a plurality of parameter settings;

measuring the fluorescence emitted from the single crystal diamond based on a plurality of the plurality of parameter settings, wherein the fluorescence emitted is not impacted by the magnetic field-generating article generating an optically-detected magnetic resonance (ODMR) spectrum based on the measured fluorescence emitted from the single crystal diamond at the plurality of the plurality of parameter settings; and selecting the first parameter setting based on the generated ODMR spectrum.

18. The method of claim 17, wherein selecting the first parameter setting based on the generated ODMR spectrum comprises identifying one of the plurality of fluorescence signals wherein the ODMR spectrum has a maximum slope.

19. The method of claim 17, wherein the plurality of parameter settings correspond to values of one or more of MW signal power, MW signal frequency, MW signal duration, and the strength of the bias magnetic field.

20. The method of claim 17, wherein the plurality of parameter settings correspond to values of one or more of a position of the single crystal diamond relative to the magnetic field-generating article and an orientation of the single crystal diamond relative to the magnetic field-generating article.

21. The method of claim 13, wherein the photosensor comprises one or more selected from the group of: a CMOS, a CCD, a photodiode array, and a single photodiode.

22. The method of claim 13, wherein the coherent light source comprises a laser.

23. The method of claim 13, wherein the microwave source comprises one or more microwave resonators or a microwave loop.

24. The method of claim 13, wherein the magnetic field source comprises one or more Helmholtz coils and/or one or more permanent magnets.

25. A non-transitory computer-readable storage medium storing instructions that, when executed by a computing device operatively coupled to a plurality of components, cause the computing device to:

control the plurality of components to operate at a first parameter setting, the plurality of components comprising:

a coherent light source configured to generate a light beam directed at a single crystal diamond, the single crystal diamond having a plurality of NV centers and configured to generate fluorescence in response to being illuminated by the coherent light source; 5 a microwave (MW) radiation source configured to irradiate the single crystal diamond with a MW signal;

a magnetic field source configured to apply a bias magnetic field to the single crystal diamond; and a photosensor configured to measure the fluorescence 10 generated by the single crystal diamond;

measure the fluorescence emitted from the single crystal diamond based on the first parameter setting, wherein the fluorescence emitted is impacted by a magnetic field-generating article disposed adjacent the single 15 crystal diamond; and determine a relative magnetic vector field of the magnetic field-generating article based on the measured fluorescence emitted from the single crystal diamond based on the first parameter setting. 20

\* \* \* \* \*